United States Patent
Nogami et al.

(10) Patent No.: US 8,501,598 B2
(45) Date of Patent: Aug. 6, 2013

(54) SEMICONDUCTOR SUBSTRATE, SEMICONDUCTOR DEVICE, AND METHOD OF PRODUCING SEMICONDUCTOR SUBSTRATE

(75) Inventors: Syouji Nogami, Tokyo (JP); Hitoshi Goto, Tokyo (JP); Takumi Shibata, Aichi (JP); Tsuyoshi Yamamoto, Aichi (JP)

(73) Assignees: Sumco Corporation, Tokyo (JP); Denso Corporation, Aichi (JP)

( * ) Notice: Subject to any disclaimer, the term of this patent is extended or adjusted under 35 U.S.C. 154(b) by 0 days.

(21) Appl. No.: 13/258,268

(22) PCT Filed: Mar. 25, 2010

(86) PCT No.: PCT/JP2010/002152
§ 371 (c)(1), (2), (4) Date: Sep. 21, 2011

(87) PCT Pub. No.: WO2010/109892
PCT Pub. Date: Sep. 30, 2010

(65) Prior Publication Data
US 2012/0032312 A1  Feb. 9, 2012

(30) Foreign Application Priority Data
Mar. 26, 2009  (JP) .................................. 2009-076472

(51) Int. Cl.
*H01L 21/20* (2006.01)
*H01L 29/06* (2006.01)

(52) U.S. Cl.
USPC .......................................... 438/493; 257/653

(58) Field of Classification Search
USPC ........... 438/388, 478, 492, 493, 495; 257/653
See application file for complete search history.

(56) References Cited

U.S. PATENT DOCUMENTS

| | | | |
|---|---|---|---|
| 2005/0221547 A1* | 10/2005 | Yamauchi et al. | 438/172 |
| 2007/0072398 A1 | 3/2007 | Shibata et al. | |
| 2007/0128836 A1* | 6/2007 | Nogami | 438/478 |
| 2008/0303114 A1* | 12/2008 | Shibata et al. | 257/495 |

FOREIGN PATENT DOCUMENTS

| | | |
|---|---|---|
| JP | 2005-294711 | 10/2005 |
| JP | 2005-317905 | 11/2005 |
| JP | 2007-096137 | 4/2007 |
| JP | 2008-305927 | 12/2008 |

* cited by examiner

*Primary Examiner* — N Drew Richards
*Assistant Examiner* — Christina Sylvia
(74) *Attorney, Agent, or Firm* — Greenblum & Bernstein, P.L.C.

(57) ABSTRACT

A semiconductor substrate which allows desired electrical characteristics to be more easily acquired, a semiconductor device of the same, and a method of producing the semiconductor substrate. The method of producing this semiconductor substrate is provided with: a first epitaxial layer forming step (S1) of forming a first epitaxial layer; a trench forming step (S2) of forming trenches in the first epitaxial layer; and epitaxial layer forming steps (S3, S4, S5) of forming epitaxial layers on the first epitaxial layer and inside the trenches, using a plurality of growth conditions including differing growth rates, so as to fill the trenches, and keeping the concentration of dopant taken into the epitaxial layers constant in the plurality of growth conditions.

9 Claims, 4 Drawing Sheets

SEMICONDUCTOR SUBSTRATE, SEMICONDUCTOR DEVICE, AND METHOD OF PRODUCING SEMICONDUCTOR SUBSTRATE

TECHNICAL FIELD

The present invention relates to a semiconductor substrate, a semiconductor device and a method of producing a semiconductor substrate.

BACKGROUND ART

Conventionally, in the field of power electronics, a power MOSFET (Metal Oxide Semiconductor Field Effect Transistor) has been used as a switching element having a high-speed switching function. As a structure of a power MOSFET, a super junction structure can be exemplified.

In the super junction structure, an n-type layer and a p-type layer are alternately formed in a conductive layer that connects a source and a drain. In the super junction structure, a depletion layer is formed in an interface between the n-type layer and the p-type layer. Accordingly, between the source and the drain, an electric field is formed not only in a direction from the source to the drain, but also in a direction from the n-type layer to the p-type layer. As a result, the electric field between the source and the drain does not concentrate on a certain part in the conductive layer. Therefore, the super junction structure can provide high voltage resistance performance.

As a method of producing a semiconductor substrate used for forming the super junction structure, a method of forming a trench in an epitaxial layer and forming a plurality of epitaxial layers in the trench thus formed is proposed (for example, refer to Patent Documents 1 and 2).

[Patent Document 1] Japanese Unexamined Patent Application Publication No. 2005-294711

[Patent Document 2] Japanese Unexamined Patent Application Publication No. 2005-317905

DISCLOSURE OF THE INVENTION

Problems to be Solved by the Invention

However, in the method disclosed in Patent Documents 1 and 2, temperature is different in formation of each of the epitaxial layers, and thus concentration of dopant is different in each of the epitaxial layers. This may prevent obtaining desired electrical characteristics (for example, resistivity).

The present invention is aimed at providing a semiconductor substrate, a semiconductor device and a method of producing a semiconductor substrate that are more likely to provide desired electrical characteristics.

Means for Solving the Problems

In a first aspect of the present invention, a method of producing a semiconductor substrate includes: a first epitaxial layer forming step of forming a first epitaxial layer by introducing a dopant gas of a first conductivity type to a semiconductor substrate of the first conductivity type; a trench forming step of forming a trench in the first epitaxial layer; and an epitaxial layer forming step of forming an epitaxial layer of a second conductivity type that is different from the first conductivity type on the first epitaxial layer and in the trench so as to fill up the trench, using a plurality of growth conditions including different growth rates, and making concentration of a dopant gas of the second conductivity type, which is incorporated into the epitaxial layer, constant in each of the plurality of growth conditions.

According to the second aspect of the present invention, in the method of producing a semiconductor substrate as described in the first aspect, it is preferable that the plurality of growth conditions includes growth temperature of the epitaxial layer; and the growth rate is changed by changing the growth temperature of the epitaxial layer.

According to the third aspect of the present invention, in the method of producing a semiconductor substrate as described in the first aspect, it is preferable that the plurality of growth conditions includes flow rate of the dopant gas of the second conductivity type that is introduced into the epitaxial layer and the trench; and the growth rate is changed by changing the flow rate of a material gas.

In a fourth aspect of the present invention, a method of producing a semiconductor substrate, includes: a first epitaxial layer forming step of forming a first epitaxial layer by introducing a dopant gas of a first conductivity type to a semiconductor substrate of the first conductivity type; a trench forming step of forming a trench in the first epitaxial layer; and a second epitaxial layer forming step of forming a second epitaxial layer on the first epitaxial layer and in the trench, by introducing a dopant gas of a second conductivity type that is different from the first conductivity type at a predetermined first dopant gas flow rate, in an atmosphere of a predetermined first temperature; a third epitaxial layer forming step of forming a third epitaxial layer to fill up the trench, by introducing the dopant gas of the second conductivity type to the second epitaxial layer at a second dopant gas flow rate that is greater than the first dopant gas flow rate, in an atmosphere of a second temperature that is lower than the first temperature; a fourth epitaxial layer forming step of forming a fourth epitaxial layer by introducing the dopant gas of the second conductivity type to the second epitaxial layer and the third epitaxial layer at a third dopant gas flow rate that is lower than the second dopant gas flow rate, in an atmosphere of a third temperature that is higher than the second temperature.

In a fifth aspect of the present invention, a method of producing a semiconductor substrate includes: a first epitaxial layer forming step of forming a first epitaxial layer by introducing a dopant gas of a first conductivity type to a semiconductor substrate of the first conductivity type; a trench forming step of forming a trench in the first epitaxial layer; and a second epitaxial layer forming step of forming a second epitaxial layer on the first epitaxial layer and in the trench, by introducing a dopant gas of a second conductivity type that is different from the first conductivity type at a predetermined first dopant gas flow rate, in an atmosphere of a predetermined first temperature; and a third epitaxial layer forming step of forming a third epitaxial layer to fill up the trench, by introducing the dopant gas of the second conductivity type to the second epitaxial layer at a second dopant gas flow rate that is greater than the first dopant gas flow rate, in an atmosphere of a second temperature that is lower than the first temperature.

In a sixth aspect of the present invention, a method of producing a semiconductor substrate includes: a first epitaxial layer forming step of forming a first epitaxial layer by introducing a dopant gas of a first conductivity type to a semiconductor substrate of the first conductivity type; a trench forming step of forming a trench in the first epitaxial layer; a second epitaxial layer forming step of forming a second epitaxial layer on the first epitaxial layer and in the trench, by introducing a dopant gas of a second conductivity type that is different from the first conductivity type at a predetermined first dopant gas flow rate, in an atmosphere of a predetermined first temperature; and a third epitaxial layer forming step of forming a third epitaxial layer to fill up the trench, by introducing the dopant gas of the second conductivity type to the second epitaxial layer at a second dopant gas flow rate that is greater than the first dopant gas flow rate, in an atmosphere of a second temperature that is higher than the first temperature.

According to a seventh aspect of the present invention, in the method of producing a semiconductor substrate as described in the fourth aspect, it is preferable that amount of dopant in the second epitaxial layer, the third epitaxial layer, and the fourth epitaxial layer is changed by changing the flow rate of the dopant gas of the second conductivity type.

According to an eighth aspect of the present invention, in the method of producing a semiconductor substrate as described in the fourth aspect, it is preferable that amount of dopant in the second epitaxial layer, the third epitaxial layer, and the fourth epitaxial layer is changed by using a plurality of gas cylinders of different concentrations of the dopant gas of the second conductivity type.

According to a ninth aspect of the present invention, in the method of producing a semiconductor substrate as described in the fourth aspect, it is preferable that at least one of the second epitaxial layer, the third epitaxial layer and the fourth epitaxial layer is formed by feeding a material gas and a halide gas in parallel in the atmosphere.

According to a tenth aspect of the present invention, in the method of producing a semiconductor substrate as described in the fourth aspect, it is preferable that amount of dopant is substantially the same in the second epitaxial layer, the third epitaxial layer and the fourth epitaxial layer.

According to an eleventh aspect of the present invention, in the method of producing a semiconductor substrate as described in the fourth aspect, it is preferable that a flow rate of a halide gas in the atmosphere is greater in the third epitaxial layer forming step than in the second epitaxial layer forming step and the fourth epitaxial layer forming step.

In a twelfth aspect of the present invention, a semiconductor substrate is manufactured by the method of producing a semiconductor substrate as described in the first aspect.

In a thirteenth aspect of the present invention, a semiconductor device uses the semiconductor substrate as described in the twelfth aspect.

Effects of the Invention

The present invention is aimed at providing a semiconductor substrate, a semiconductor device and a method of producing a semiconductor substrate that are more likely to provide desired electrical characteristics.

PREFERRED MODE FOR CARRYING OUT THE INVENTION

Figure 1:
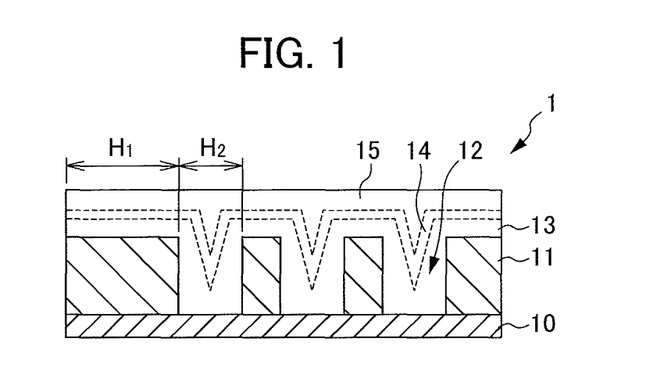
FIG. 1 is a partial cross-sectional view schematically showing an embodiment of a semiconductor substrate according to the present invention.

A semiconductor substrate of the present invention is described hereinafter with reference to the drawings. FIG. 1 is a partial cross-sectional view schematically showing an embodiment of a semiconductor substrate according to the present invention.

As shown in FIG. 1, in the semiconductor substrate 1 of the present embodiment, a first epitaxial layer 11 is formed on a silicon substrate 10 and a plurality of trenches 12 is formed in the first epitaxial layer 11. In the trenches 12, a second epitaxial layer 13, the third epitaxial layer 14 and a fourth epitaxial layer 15 are sequentially formed. In addition, the fourth epitaxial layer 15 is formed also on the first epitaxial layer 11.

The silicon substrate 10 is an n+ type silicon substrate to which an n-type dopant is introduced to single crystal silicon at a high concentration. The first epitaxial layer 11 is formed on the silicon substrate 10. The first epitaxial layer 11 is an n-type silicon epitaxial layer to which an n-type dopant is introduced at a lower concentration than in the silicon substrate 10.

The plurality of trenches 12 is formed in the first epitaxial layer 11. A bottom face of the trenches 12 is a main surface of the silicon substrate 10. The trenches 12 are substantially in a rectangular pole shape. A side face of the trenches 12 is an inner side face of the first epitaxial layer 11. The second epitaxial layer 13 is formed on a main surface of the first epitaxial layer 11 and in the trenches 12. The second epitaxial layer 13 is a p-type silicon epitaxial layer to which a p-type dopant is introduced.

The third epitaxial layer 14 is formed on the second epitaxial layer 13. The third epitaxial layer 14 is a p-type silicon epitaxial layer to which a p-type dopant is introduced. The second epitaxial layer 13 and the third epitaxial layer 14 fill up almost an entirety of the trenches 12 except for a part thereof.

The fourth epitaxial layer 15 is formed on a main surface of the second epitaxial layer 13 and a main surface of the third epitaxial layer 14 that are formed on the main surface of the first epitaxial layer 11, as well as in the part of the trenches 12 that has not been filled. The fourth epitaxial layer 15 is a p-type silicon epitaxial layer to which a p-type dopant is introduced.

Here, the first epitaxial layer 11 is composed of an n-type epitaxial layer to which a dopant such as P (phosphorus), As (arsenic), Sb (antimony) and the like is introduced. In addition, the second epitaxial layer 13, the third epitaxial layer 14, and the fourth epitaxial layer 15 are composed of a p-type epitaxial layer to which a dopant such as B (boron), Ga (gallium) and In (indium) is introduced.

A conductivity type of the second epitaxial layer 13, the third epitaxial layer 14 and the fourth epitaxial layer 15 is different from that of the first epitaxial layer 11. A conductivity type that is different is p-type for n-type, or n-type for p-type. Therefore, for example, if a conductivity type of the first epitaxial layer 11 is n-type, a conductivity type of the second epitaxial layer 13, the third epitaxial layer 14 and the fourth epitaxial layer 15 is p-type.

As desribed above, the semiconductor substrate 1 has a super junction structure in which the first epitaxial layer 11 that is n-type, the second epitaxial layer 13, the third epitaxial layer 14, and the fourth epitaxial layer 15 that are p-type are formed alternately on the silicon substrate 10.

Here, provided that: a width of the first epitaxial layer 11 is $H_1$ (μm); a width of the second epitaxial layer 13, the third epitaxial layer 14, and the fourth epitaxial layer 15 is $H_2$ (μm); carrier concentration of the first epitaxial layer 11 is $C_1$ ($cm^{-3}$); and carrier concentration of the second epitaxial layer 13, the third epitaxial layer 14, and the fourth epitaxial layer 15 is $C_2$ ($cm^{-3}$), at least one of the width $H_1$ of the first epitaxial layer 11 and the width $H_2$ of the second epitaxial layer 13, the third epitaxial layer 14, and the fourth epitaxial layer 15 fulfils an equation $C_1 \times H_1 = C_2 \times H_2$. Therefore, amount of dopant included in the first epitaxial layer 11 and amount of dopant included in the second epitaxial layer 13, the third epitaxial layer 14 and the fourth epitaxial layer 15 are substantially the same. As a result, a p-n junction between: the first epitaxial layer 11 that is n-type; and the second epitaxial layer 13, the third epitaxial layer 14, and the fourth epitaxial layer 15 that are p-type, provides a depletion layer to fully deplete a drift region, thereby maintaining high voltage resistance performance.

Figure 2:
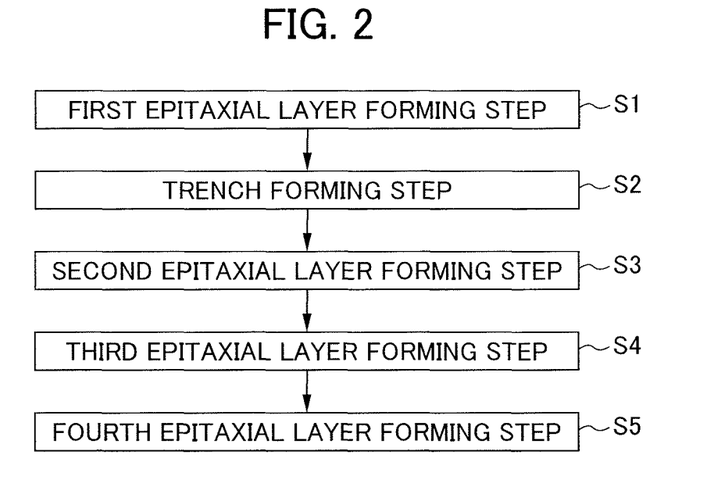
FIG. 2 is a flow chart showing an embodiment of a method of producing the semiconductor substrate according to the present invention.

A method of producing a semiconductor substrate according to the present embodiment is hereinafter described with reference to FIGS. 2 and 3. FIG. 2 is a flow chart showing an embodiment of a method of producing the semiconductor substrate according to the present invention. FIGS. 3A to 3E are partial cross-sectional views sequentially showing changes in the semiconductor substrate 1 in the method of producing a semiconductor substrate shown in FIG. 2.

As shown in FIG. 2, the method of producing a semiconductor substrate according to the present embodiment includes: a first epitaxial layer forming step S1; a trench forming step S2; a second epitaxial layer forming step S3; a third epitaxial layer forming step S4; and a fourth epitaxial layer forming step S5. Each step (S1 to S5) is described hereinafter, with reference to FIG. 3 as necessary.

(S1) First Epitaxial Layer Forming Step

Figure 3A:
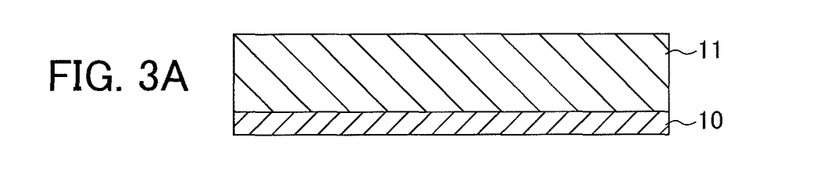
FIG. 3A is a partial cross-sectional view sequentially showing changes in a cross section of a semiconductor substrate 1 in the method of producing a semiconductor substrate shown in FIG. 2.

As shown in FIG. 3A, an n-type dopant gas is supplied while supplying a material gas to the silicon substrate 10 of n+ type, thereby forming the first epitaxial layer 11 in an atmosphere containing the material gas and the dopant gas.

Here, as the material gas (silicon source gas), $SiH_4$ (monosilane), $Si_2H_6$ (disilane), $SiH_2Cl_2$ (dichlorosilane), $SiHCl_3$ (trichlorosilane), $SiCl_4$ (silicon tetrachloride) and the like can be exemplified.

As the dopant gas for formation of an n-type epitaxial layer, phosphine ($PH_3$) that contain phosphorus (P) and arsine ($AsH_3$) that contain arsenic (As), which are n-type dopants, can be exemplified. On the other hand, as the dopant gas for formation of a p-type epitaxial layer, diborane ($B_2H_6$) and boron trichloride ($BCl_3$) that contain boron (B), which are p-type dopants, can be exemplified. As for the material gas and the dopant gas, the abovementioned gases can be used similarly in the second epitaxial layer forming step S3, the third epitaxial layer forming step S4 and the fourth epitaxial layer forming step S5 that are described later.

Although a method for forming the first epitaxial layer 11, the second epitaxial layer 13, the third epitaxial layer 14 and the fourth epitaxial layer 15 is not particularly limited, chemical vapor deposition (CVD), physical vapor deposition (PVD), molecular beam epitaxy (MBE) and the like are preferably used.

(S2) Trench Forming Step

Figure 3B:
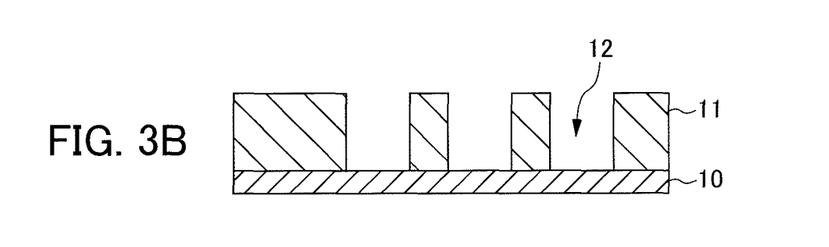
FIG. 3B is a partial cross-sectional view sequentially showing changes in a cross section of a semiconductor substrate 1 in the method of producing a semiconductor substrate shown in FIG. 2.

As shown in FIG. 3B, a resist pattern is formed by photolithography at a predetermined position on the first epitaxial layer 11 formed in the first epitaxial layer forming step S1. And then, a region in which the resist pattern is not formed on the first epitaxial layer 11 is etched by, for example, reactive ion etching, thereby forming the trenches 12. Thereafter, the trenches 12 shown in FIG. 3B are obtained by removing the resist pattern.

(S3) Second Epitaxial Layer Forming Step

Figure 3C:
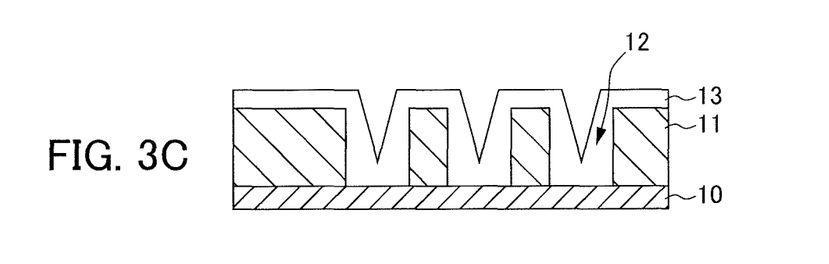
FIG. 3C is a partial cross-sectional view sequentially showing changes in a cross section of a semiconductor substrate 1 in the method of producing a semiconductor substrate shown in FIG. 2.

As shown in FIG. 3C, after the trench forming step S2, a p-type dopant gas is introduced to the first epitaxial layer 11 and the trenches 12, while supplying the material gas and the halide gas thereto, thereby forming the second epitaxial layer 13 in an atmosphere containing the material gas, the halide gas, and the dopant gas. A temperature of the atmosphere containing the material gas, the halide gas, and the dopant gas is preferably 950 to 1000° C. (predetermined first temperature), and a flow rate of the dopant gas (predetermined first dopant gas flow rate) is preferably 100 to 300 sccm (Standard Cubic Centimeter per Minute). In addition, an amount of dopant in the second epitaxial layer 13 (first dopant amount) is preferably $1 \times 10^{15}$ to $1 \times 10^{17}$ ($cm^{-3}$).

In the present embodiment, the dopant amount is a value defined, before incorporation of a dopant gas by an epitaxial layer, by a flow rate and concentration of the dopant gas; and, after incorporation of the dopant gas by the epitaxial layer, defined by a density of dopant atoms in a crystal lattice of the epitaxial layer.

As the halide gas, HCl (hydrogen chloride), $Cl_2$ (chlorine), $F_2$ (fluorine), $CLF_3$ (chlorine trifluoride), HF (hydrogen fluoride), HBr (hydrogen bromide) and the like can be exemplified. As for the halide gas, the abovementioned gases can be used similarly in the third epitaxial layer forming step S4 and the fourth epitaxial layer forming step S5 that are described later.

In a case of supplying the material gas and the halide gas, the halide gas functions as an etching gas inside the trenches 12. Since an etching rate of the halide gas is slower in a bottom part of the trenches 12 than in an opening part of the trenches 12, a formation rate of an epitaxial layer is faster in the bottom part than in the opening part of the trenches 12. Generation of a void in the second epitaxial layer 13 formed in the trenches 12 can thus be prevented.

(S4) Third Epitaxial Layer Forming Step

Figure 3D:
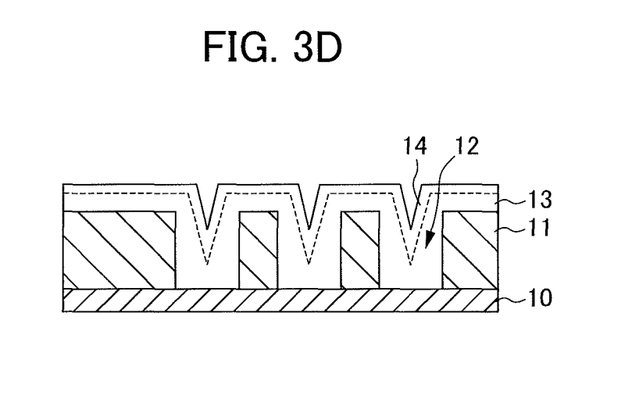
FIG. 3D is a partial cross-sectional view sequentially showing changes in a cross section of a semiconductor substrate 1 in the method of producing a semiconductor substrate shown in FIG. 2.

As shown in FIG. 3D, after the second epitaxial layer forming step S3, a p-type dopant gas is introduced to the second epitaxial layer 13, while supplying the material gas and the halide gas thereto, thereby forming the third epitaxial layer 14 to fill up the trenches 12, in an atmosphere containing the material gas, the halide gas, and the dopant gas. The third epitaxial layer 14 is formed also in a region on the second epitaxial layer 13, outside of the trenches 12. A temperature of the atmosphere containing the material gas, the halide gas, and the dopant gas is 900 to 950° C. (second temperature), which is lower than that in the second epitaxial layer forming step S3. In addition, a flow rate of the p-type dopant gas (second dopant gas flow rate), is 110 to 360 sccm, which is higher than that in the second epitaxial layer forming step S3. In addition, an amount of dopant in the third epitaxial layer 14 (second dopant amount) is preferably $1 \times 10^{15}$ to $1 \times 10^{17}$ ($cm^{-3}$).

A difference between the temperature of the atmosphere in the second epitaxial layer forming step S3 and the temperature of the atmosphere in the third epitaxial layer forming step S4 is preferably at least 10° C., and more preferably at least 50° C. In addition, a difference between the flow rate of the p-type dopant gas in the second epitaxial layer forming step S3 and the flow rate of the p-type dopant gas in the third epitaxial layer forming step S4 is preferably at least 5 sccm, and more preferably at least 30 sccm.

By going through the third epitaxial layer forming step S4, the second epitaxial layer 13 and the third epitaxial layer 14 fill up almost an entirety of the trenches 12 except for a part thereof. A temperature of the atmosphere in the third epitaxial layer forming step S4 is lower than that in the second epitaxial layer forming step S3. Generation of a void and crystal defect in the third epitaxial layer 14 can thus be prevented.

(S5) Fourth Epitaxial Layer Forming Step

Figure 3E:
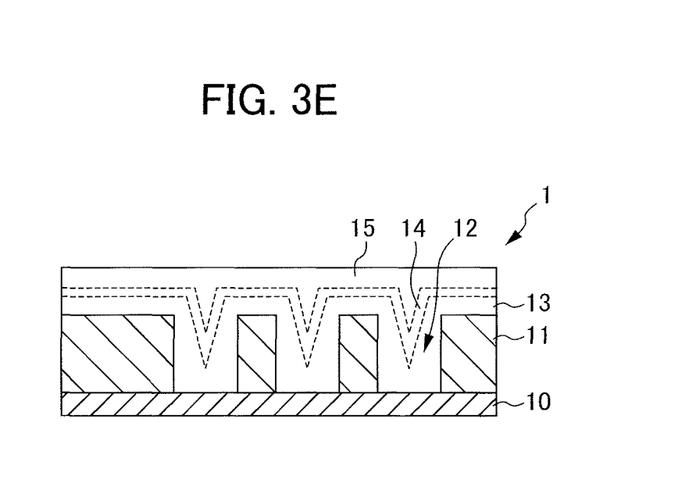
FIG. 3E is a partial cross-sectional view sequentially showing changes in a cross section of a semiconductor substrate 1 in the method of producing a semiconductor substrate shown in FIG. 2.

As shown in FIG. 3E, after the third epitaxial layer forming step S4, a p-type dopant gas is introduced to the second epitaxial layer 13 and the third epitaxial layer 14, while supplying the material gas and the halide gas thereto, thereby forming the fourth epitaxial layer 15 in an atmosphere containing the material gas, the halide gas, and the dopant gas. A temperature of the atmosphere containing the material gas, the halide gas, and the dopant gas is 950 to 1000° C. (third temperature), which is higher than that in the third epitaxial layer forming step S4. In addition, a flow rate of the p-type dopant gas (third dopant gas flow rate), is 100 to 300 sccm, which is lower than that in the third epitaxial layer forming step S4. In addition, an amount of dopant in the fourth epitaxial layer 15 (third dopant amount) is preferably $1 \times 10^{15}$ to $1 \times 10^{17}$ ($cm^{-3}$).

A difference between the temperature of the atmosphere in the fourth epitaxial layer forming step S5 and the temperature of the atmosphere in the third epitaxial layer forming step S4 is preferably at least 10° C., and more preferably at least 50° C. In addition, a difference between the flow rate of the p-type dopant gas in the fourth epitaxial layer forming step S5 and the flow rate of the p-type dopant gas in the third epitaxial layer forming step S4 is preferably at least 5 sccm, and more preferably at least 30 sccm.

In the abovementioned embodiment, a conductivity type of the silicon substrate 10 and the first epitaxial layer 11 is n-type, and a conductivity type of the second epitaxial layer 13, the third epitaxial layer 14 and the fourth epitaxial layer 15 is p-type; however, the present invention is not limited thereto. For example, the conductivity type of the silicon substrate 10 and the first epitaxial layer 11 can be p-type, and the conductivity type of the second epitaxial layer 13, the third epitaxial layer 14 and the fourth epitaxial layer 15 can be n-type.

In this case, a flow rate of the n-type dopant gas in the third epitaxial layer forming step S4 is lower than that in the second epitaxial layer forming step S3. In addition, a flow rate of the n-type dopant gas in the fourth epitaxial layer forming step S5 is lower than that in the third epitaxial layer forming step S4.

As described above, in the method of producing a semiconductor substrate according to the present embodiment, the second epitaxial layer 13, the third epitaxial layer 14 and the fourth epitaxial layer 15 are formed on the first epitaxial layer 11 and the trenches 12 to fill up the trenches 12, using a plurality of growth conditions including different growth rates. In this case, in the method of producing a semiconductor substrate according to the present embodiment, in each of the plurality of growth conditions, concentration of the p-type dopant incorporated into the second epitaxial layer 13, the third epitaxial layer 14 and the fourth epitaxial layer 15 is constant.

Here, the plurality of growth conditions includes growth temperature of the second epitaxial layer 13, the third epitaxial layer 14 and the fourth epitaxial layer 15. The abovementioned growth rate is changed by changing the growth temperature of the second epitaxial layer 13, the third epitaxial layer 14 and the fourth epitaxial layer 15.

In addition, the plurality of growth conditions can include a flow rate of the p-type dopant gas incorporated into the trenches 12, the second epitaxial layer 13, the third epitaxial layer 14 and the fourth epitaxial layer 15. In this case, the growth rate is changed by changing the flow rate of the material gas (silicon source gas).

More specifically, a temperature of the atmosphere in the second epitaxial layer forming step S3 and the fourth epitaxial layer forming step S5 (approximately 950 to 1000° C.) is higher than that in the third epitaxial layer forming step S4 (approximately 900 to 950° C.). As a result, in the second epitaxial layer forming step S3 and the fourth epitaxial layer forming step S5, a formation rate of the second epitaxial layer 13 and the fourth epitaxial layer 15 can be increased and throughput can be improved.

In addition, since a temperature of the atmosphere in the second epitaxial layer forming step S3 and the fourth epitaxial layer forming step S5 (approximately 950 to 1000° C.) is higher than that in the third epitaxial layer forming step S4 (approximately 900 to 950° C.), dopant concentration in the third epitaxial layer 14 tends to be lower than that of the second epitaxial layer 13 and the fourth epitaxial layer 15. Accordingly, in order to suppress change in the dopant concentration, a flow rate of the dopant gas in the third epitaxial layer forming step S4 is set to be lower than that in the second epitaxial layer forming step S3 and the fourth epitaxial layer forming step S5.

At least one of the second epitaxial layer 13, the third epitaxial layer 14 and the fourth epitaxial layer 15 is preferably formed by feeding a material gas and a halide gas in parallel in the atmosphere. More specifically, for example the second epitaxial layer 13 and the third epitaxial layer 14 are formed by feeding a material gas and a halide gas in parallel in the atmosphere of the second epitaxial layer forming step S3 and the third epitaxial layer forming step S4.

In addition, the flow rate of the halide gas in the atmosphere is preferably greater in the third epitaxial layer forming step S4 than in the second epitaxial layer forming step S3 and the fourth epitaxial layer forming step S5.

In addition, the dopant concentration or the dopant amount of the second epitaxial layer 13, the third epitaxial layer 14 and the fourth epitaxial layer 15 is preferably substantially the same. The dopant concentration being substantially the same means that a difference in the dopant amount is no greater than ±5%.

According to the method of manufacturing a semiconductor substrate according to the present embodiment, the following effect is provided for example. The method of producing a semiconductor substrate according to the present embodiment is provided with: the first epitaxial layer forming step S1 of forming the first epitaxial layer 11; the trench forming step S2 of forming the trenches in the first epitaxial layer; the second epitaxial layer forming step S3 of forming the second epitaxial layer on the first epitaxial layer 11 and inside the trenches 12; the third epitaxial layer forming step S4 of forming the third epitaxial layer 14 on the second epitaxial layer 13; and the fourth epitaxial layer forming step S5 of forming the fourth epitaxial layer on the second epitaxial layer and the third epitaxial layer.

In addition, a temperature of the atmosphere in the second epitaxial layer forming step S3 and the fourth epitaxial layer forming step S5 is higher than that in the third epitaxial layer forming step S4, and a flow rate of the dopant gas in the third epitaxial layer forming step S4 is higher than in the second epitaxial layer forming step S3 and the fourth epitaxial layer forming step S5.

As a result, since the dopant concentration of the second epitaxial layer 13, the third epitaxial layer 14, and the fourth epitaxial layer 15 can be made substantially the same, in resistivity measurement of the semiconductor substrate 1, for example, resistivity of the second epitaxial layer 13, the third epitaxial layer 14, and the fourth epitaxial layer 15 is substantially the same. In other words, the method of producing a semiconductor substrate of the present embodiment can provide desired electrical characteristics. Therefore, a power MOSFET that is manufactured using the semiconductor substrate 1 including the second epitaxial layer 13, the third epitaxial layer 14, and the fourth epitaxial layer 15 of the present embodiment (see FIG. 4 or 5) can provide desired electrical characteristics such as high voltage resistance performance and on resistance.

The method of producing a semiconductor substrate can provide the same effect even if a flow rate of at least one of the material gas and the halide gas is changed.

In the abovementioned embodiment, the growth temperature is changed in three levels in the second epitaxial layer forming step S3, the third epitaxial layer forming step S4 and the fourth epitaxial layer forming step S5; however, the present invention is not limited thereto. In the method of producing a semiconductor substrate of the present invention, the growth temperature of the epitaxial layer inside the trenches 12 can be changed in two levels, for example. In a case of changing the growth temperature in two levels, for example, the growth temperature of the epitaxial layer can be changed from approximately 950 to 1000° C. to approximately 900 to 950° C., or from approximately 900 to 950° C. to approximately 950 to 1000° C.

In other words, the method of producing a semiconductor substrate according to the present invention can include: the first epitaxial layer forming step S1; the trench forming step S2; the second epitaxial layer forming step S3; and the third epitaxial layer forming step S4.

In this case, in the second epitaxial layer forming step S3, the second epitaxial layer 13 of p-type is formed by introducing a p-type dopant gas to the first epitaxial layer 11 and the trenches 12 of n-type, at the first dopant gas flow rate, in an atmosphere of approximately 950 to 1000° C.

In addition, in the third epitaxial layer forming step S4, the third epitaxial layer 14 of p-type is formed to fill up the trenches 12, by introducing a p-type dopant gas to the second epitaxial layer 13, at the second dopant gas flow rate that is higher than the first dopant gas flow rate, in an atmosphere of approximately 900 to 950° C.

Alternatively, in a case in which the first epitaxial layer 11 is p-type and the second epitaxial layer 13 and the third epitaxial layer 14 are n-type, in the second epitaxial layer forming step S3, the second epitaxial layer 13 is formed by introducing an n-type dopant gas to the first epitaxial layer 11 and the trenches 12, at the first dopant gas flow rate, in an atmosphere of approximately 950 to 1000° C. In addition, in the third epitaxial layer forming step S4, the third epitaxial layer 14 of n-type is formed to fill up the trenches 12, by introducing an n-type dopant gas at the second dopant gas flow rate that is lower than the first dopant gas flow rate, in an atmosphere of approximately 900 to 950° C.

As described above, in the second epitaxial layer forming step S3, the second epitaxial layer 13 is formed in an atmosphere of approximately 950 to 1000° C. In the third epitaxial layer forming step S4, the third epitaxial layer 14 is formed in an atmosphere of approximately 900 to 950° C., a growth temperature lower than that of the second epitaxial layer 13. In this case, the fourth epitaxial layer 15 is not formed and the second epitaxial layer 13 and the third epitaxial layer 14 are formed to fill up the trenches 12.

Furthermore, in the second epitaxial layer forming step S3, the second epitaxial layer 13 can be formed by introducing a p-type dopant gas to the first epitaxial layer 11 and the trenches 12, at the first dopant gas flow rate, in an atmosphere of approximately 900 to 950° C.

In addition, in the third epitaxial layer forming step S4, the third epitaxial layer 14 can be formed to fill up the trenches 12, by introducing a p-type dopant gas to the second epitaxial layer 13, at the second dopant gas flow rate that is higher than the first dopant gas flow rate, in an atmosphere of approximately 950 to 1000° C. In this case, the fourth epitaxial layer 15 is not formed and the second epitaxial layer 13 and the third epitaxial layer 14 are formed to fill up the trenches 12.

In a case in which the first epitaxial layer 11 is p-type and the second epitaxial layer 13 and the third epitaxial layer 14 are n-type, in the second epitaxial layer forming step S3, the second epitaxial layer 13 can be formed by introducing an n-type dopant gas to the first epitaxial layer 11 and the trenches 12, at the first dopant gas flow rate, in an atmosphere of approximately 900 to 950° C. In addition, in the third epitaxial layer forming step S4, the third epitaxial layer 14 can be formed to fill up the trenches 12, by introducing an n-type dopant gas at the second dopant gas flow rate that is lower than the first dopant gas flow rate, in an atmosphere of approximately 950 to 1000° C. In this case, the fourth epitaxial layer 15 is not formed and the second epitaxial layer 13 and the third epitaxial layer 14 are formed to fill up the trenches 12.

Here, the first dopant amount of the second epitaxial layer 13, the second dopant amount of the third epitaxial layer 14, and the third dopant amount of the fourth epitaxial layer 15 are changed by changing the flow rate of the dopant gas of p-type or n-type. In addition, the first dopant amount, the second dopant amount and the third dopant amount are changed by using a plurality of cylinders of different concentrations of the dopant gas of p-type and n-type.

As described above, in the method of producing a semiconductor substrate of the present invention, the growth temperature can be changed in four levels, not in two or three levels, and the epitaxial layer can be formed inside the trenches 12 while consecutively changing the growth temperature. In addition, although only the growth temperature is changed in the method of producing a semiconductor substrate according to the abovementioned embodiment; however, the present invention is not limited thereto. For example, in the method of producing a semiconductor substrate, the flow rate of at least one of the material gas and the halide gas can be changed.

Figure 4:
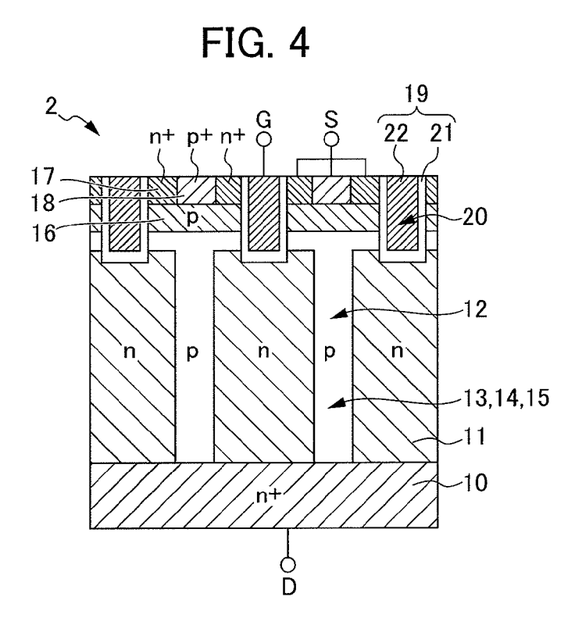
FIG. 4 is a partial cross-sectional view schematically showing an embodiment of a semiconductor device according to the present invention.
Figure 5:
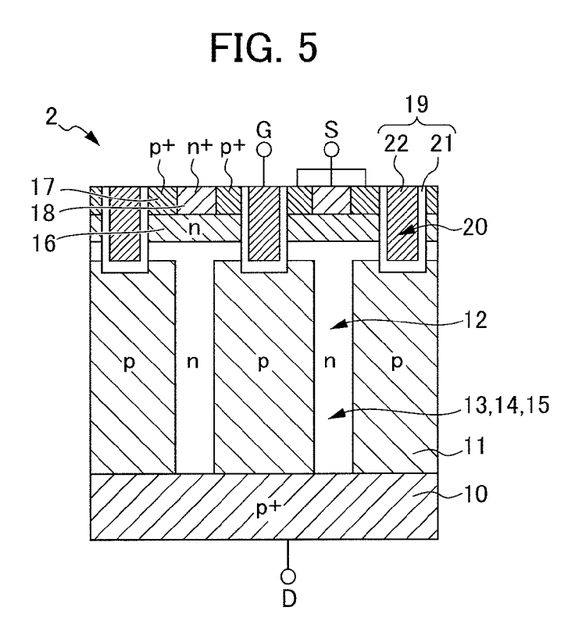
FIG. 5 is a partial cross-sectional view schematically showing another embodiment of a semiconductor device according to the present invention.

Next, a structure of a power MOSFET 2 as a semiconductor device produced using the semiconductor substrate 1 according to the present embodiment is hereinafter described with reference to FIGS. 4 and 5. FIG. 4 is a partial cross-sectional view schematically showing an embodiment of a semiconductor device according to the present invention. FIG. 5 is a partial cross-sectional view schematically showing another embodiment of a semiconductor device according to the present invention.

As shown in FIG. 4, the n-channel power MOSFET 2 includes: the silicon substrate 10; the first epitaxial layer 11; the second epitaxial layer 13; the third epitaxial layer 14; the fourth epitaxial layer 15; the fifth epitaxial layer 16; a source region 17; an ohmic contact region 18; and a trench insulated gate electrode 19.

The silicon substrate 10 is a drain region. As described above, the first epitaxial layer 11 is an n-type epitaxial layer formed on the silicon substrate 10.

The second epitaxial layer 13, the third epitaxial layer 14 and the fourth epitaxial layer 15 are p-type epitaxial layers. The second epitaxial layer 13, the third epitaxial layer 14 and the fourth epitaxial layer 15 are formed alternately on the first epitaxial layer 11 and in the trenches 12 that are formed in the first epitaxial layer 11 at predetermined intervals, to be adjacent to the first epitaxial layer 11.

The fifth epitaxial layer 16 is a p-type epitaxial layer formed on the fourth epitaxial layer 15. The fifth epitaxial layer 16 functions as a channel forming layer.

The fifth epitaxial layer 16 is a p-type epitaxial layer formed on the fourth epitaxial layer 15. The fifth epitaxial layer 16 functions as a channel forming layer. For example, the fifth epitaxial layer 16 is formed on the fourth epitaxial layer 15, after flattening of a surface of the fourth epitaxial layer by polishing.

The n-type source region 17 and the p-type ohmic contact region 18 are formed on the fourth epitaxial layer 15. The n-type source region 17 is formed by, for example, ion implantation of an n-type dopant to a p-type epitaxial layer. The p-type ohmic contact region 18 is formed by, for example, ion implantation of a p-type dopant.

The trench insulated gate electrode 19 is formed to penetrate the source region 17, the fifth epitaxial layer 16, the fourth epitaxial layer 15, the third epitaxial layer 14 and a part of the second epitaxial layer 13. For example, in a step of forming the trench insulated gate electrode 19, a trench 20 that penetrates the source region 17, the fifth epitaxial layer 16, the fourth epitaxial layer 15, the third epitaxial layer 14 and a part of the second epitaxial layer 13 is formed. On a bottom face and lateral face of the trench 20, an insulating film 21 is formed by a thermal oxidation method, a CVD method or the like. The trench insulated gate electrode 19 is composed of polycrystal silicon 22 and formed on the insulating film 21 to fill up the trench 20.

In the power MOSFET 2 thus obtained, dopant amount in the second epitaxial layer 13, the third epitaxial layer 14 and the fourth epitaxial layer 15 is constant in the whole area of the second epitaxial layer 13, the third epitaxial layer 14 and the fourth epitaxial layer 15. In addition, the power MOSFET 2 shown in FIG. 5 can be obtained by reversing the conductivity types of the components of the power MOSFET 2 shown in FIG. 4.

A semiconductor substrate and the method of producing the same according to the present invention have been described above; however, the present invention is not limited thereto. For example, a conductivity type of the silicon substrate 10 and the first epitaxial layer 11 is n-type, and a conductivity type of the second epitaxial layer 13, the third epitaxial layer 14 and the fourth epitaxial layer 15 is p-type; however, the present invention is not limited thereto. For example, the conductivity type of the silicon substrate 10 and the first epitaxial layer 11 can be p-type, and the conductivity type of the second epitaxial layer 13, the third epitaxial layer 14 and the fourth epitaxial layer 15 can be n-type.

In addition, a semiconductor substrate using silicon has been described in the above embodiment; however, the present invention is not limited thereto. For example, a compound semiconductor such as silicon carbide (SiC), gallium arsenide (GaAs) and gallium nitride (GaN) can also be used.

(が 行) EXAMPLES

Next, the present invention is described further in detail using Examples. Examples are not intended to limit the scope of the present invention.

Example 1

The semiconductor substrate 1 shown in FIG. 1 was produced by performing the steps S1 to S5 described in the above embodiment. A temperature of an atmosphere and a dopant flow rate in formation of the second epitaxial layer 13, the third epitaxial layer 14 and a fourth epitaxial layer 15 are shown below. As the dopant, diborane ($B_2H_6$) gas in concentration of 100 ppm was used.

The temperature of the atmosphere during formation of the second epitaxial layer was 970° C. and the dopant gas flow rate was 220 sccm. The temperature of the atmosphere during formation of the third epitaxial layer was 950° C. and the dopant gas flow rate was 250 sccm. The temperature of the atmosphere during formation of the fourth epitaxial layer was 980° C. and the dopant gas flow rate was 210 sccm.

Thereafter, resistivity of the semiconductor substrate 1 obtained by the steps S1 to S5 was measured and electrical characteristics thereof were evaluated using spreading resistance measurement device. In Example 1, variation in resistivity profile in a thickness direction (for example, maximum value−minimum value) was no greater than ±2%.

Comparative Example 1

Unlike Example 1, the dopant gas flow rate in an atmosphere during the third epitaxial layer forming step S4 was 220 sccm. Other conditions were the same as in Example 1. In Comparative Example 1, variation in resistivity profile in a thickness direction was ±11%.

Evaluation results of Example 1 and Comparative Example 1 show the following, for example. Example 1 provided resistivity profile in a thickness direction more uniform than in Comparative Example 1. In other words, the dopant concentration of each of the second epitaxial layer, the third epitaxial layer and the fourth epitaxial layer does not change significantly and is substantially the same. Accordingly, Example 1 was found to provide the electrical characteristics that are suitable for production of a MOSFET having a super junction structure.

EXPLANATION OF REFERENCE NUMERALS

1 Semiconductor substrate
10 Silicon substrate
11 First epitaxial layer
12 Trench
13 Second epitaxial layer (epitaxial layer)
14 Third epitaxial layer (epitaxial layer)
15 Fourth epitaxial layer (epitaxial layer)
S1 First epitaxial layer forming step
S2 Trench forming step
S3 Second epitaxial layer forming step (epitaxial layer forming step)

S4 Third epitaxial layer forming step (epitaxial layer forming step)

S5 Fourth epitaxial layer forming step (epitaxial layer forming step)

The invention claimed is:

1. A method of producing a semiconductor substrate, the method comprising:
    a first epitaxial layer forming step of forming a first epitaxial layer by introducing a dopant gas of a first conductivity type to a semiconductor substrate of the first conductivity type;
    a trench forming step of forming a trench in the first epitaxial layer; and
    a second epitaxial layer forming step of forming a second epitaxial layer on the first epitaxial layer and in the trench, by introducing a dopant gas of a second conductivity type that is different from the first conductivity type at a predetermined first dopant gas flow rate, in an atmosphere of a predetermined first temperature;
    a third epitaxial layer forming step of forming a third epitaxial layer to fill up the trench, by introducing the dopant gas of the second conductivity type to the second epitaxial layer at a second dopant gas flow rate that is greater than the first dopant gas flow rate, in an atmosphere of a second temperature that is lower than the first temperature;
    a fourth epitaxial layer forming step of forming a fourth epitaxial layer by introducing the dopant gas of the second conductivity type to the second epitaxial layer and the third epitaxial layer at a third dopant gas flow rate that is lower than the second dopant gas flow rate, in an atmosphere of a third temperature that is higher than the second temperature.

2. The method of producing a semiconductor substrate according to claim 1, wherein amount of dopant in the second epitaxial layer, the third epitaxial layer, and the fourth epitaxial layer is changed by changing the flow rate of the dopant gas of the second conductivity type.

3. The method of producing a semiconductor substrate according to claim 1, wherein amount of dopant in the second epitaxial layer, the third epitaxial layer, and the fourth epitaxial layer is changed by using a plurality of gas cylinders of different concentrations of the dopant gas of the second conductivity type.

4. The method of producing a semiconductor substrate according to claim 1, wherein at least one of the second epitaxial layer, the third epitaxial layer and the fourth epitaxial layer is formed by feeding a material gas and a halide gas in parallel in the atmosphere.

5. The method of producing a semiconductor substrate according to claim 1, wherein amount of dopant is substantially the same in the second epitaxial layer, the third epitaxial layer and the fourth epitaxial layer.

6. The method of producing a semiconductor substrate according to claim 1, wherein a flow rate of a halide gas in the atmosphere is greater in the third epitaxial layer forming step than in the second epitaxial layer forming step and the fourth epitaxial layer forming step.

7. A semiconductor substrate, wherein the semiconductor substrate is manufactured by the method of producing a semiconductor substrate according to claim 1.

8. A semiconductor device, wherein the semiconductor substrate according to claim 7 is used.

9. A method of producing a semiconductor substrate, the method comprising:
    a first epitaxial layer forming step of forming a first epitaxial layer by introducing a dopant gas of a first conductivity type to a semiconductor substrate of the first conductivity type;
    a trench forming step of forming a trench in the first epitaxial layer;
    a second epitaxial layer forming step of forming a second epitaxial layer on the first epitaxial layer and in the trench, by introducing a dopant gas of a second conductivity type that is different from the first conductivity type at a predetermined first dopant gas flow rate, in an atmosphere of a predetermined first temperature; and
    a third epitaxial layer forming step of forming a third epitaxial layer to fill up the trench, by introducing the dopant gas of the second conductivity type to the second epitaxial layer at a second dopant gas flow rate that is greater than the first dopant gas flow rate, in an atmosphere of a second temperature that is higher than the first temperature.

* * * * *